(12) United States Patent  
Nagase

(10) Patent No.: US 7,491,640 B2  
(45) Date of Patent: Feb. 17, 2009

(54) METHOD OF MANUFACTURING SEMICONDUCTOR DEVICE

(75) Inventor: Masatoshi Nagase, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/073,274

(22) Filed: Mar. 3, 2008

(65) Prior Publication Data

US 2008/0166873 A1 Jul. 10, 2008

Related U.S. Application Data

(62) Division of application No. 11/365,873, filed on Mar. 2, 2006, now Pat. No. 7,354,859.

(30) Foreign Application Priority Data

Mar. 2, 2005 (JP) .............................. 2005-057972

(51) Int. Cl.  
*H01L 21/4763* (2006.01)

(52) U.S. Cl. ................ 438/638; 438/687; 257/E21.579

(58) Field of Classification Search ................ 438/638, 438/687; 257/E21.579  
See application file for complete search history.

(56) References Cited

U.S. PATENT DOCUMENTS 6,350,675 B1 2/2002 Chooi et al.

2003/0032278 A1 2/2003 Chen et al.  
2003/0119307 A1 6/2003 Bekiaris et al.  
2004/0115565 A1 6/2004 Lassig et al.  
2004/0137711 A1 7/2004 Deguchi  
2004/0166666 A1* 8/2004 Usami .................. 438/629  
2004/0198062 A1* 10/2004 Ye et al. .................. 438/706  
2005/0037605 A1* 2/2005 Kim et al. ............... 438/622  
2008/0146029 A1* 6/2008 Baks et al. .............. 438/671

FOREIGN PATENT DOCUMENTS

JP 11-163143 6/1999

* cited by examiner

*Primary Examiner*—Trung Dang  
(74) *Attorney, Agent, or Firm*—Young & Thompson

(57) ABSTRACT

In a dual damascene process to form a fine interconnection structure, a semiconductor manufacturing method includes: forming a first film to be etched on an insulating layer on a semiconductor substrate; forming a first mask film with an opening on the first film; forming a second film to be etched on the first mask film, burying the opening; forming a second mask film on the second film to be etched; forming an interconnection pattern in the second mask film in the upper portion of the opening; forming an interconnection pattern by etching the second film using the second mask film, forming a via pattern by etching the first film to be etched using the first mask film; and forming a via hole and an interconnection trench in the upper portion of the via hole in the insulating layer by selectively etching the insulating layer using the interconnection and via patterns.

5 Claims, 7 Drawing Sheets

METHOD OF MANUFACTURING SEMICONDUCTOR DEVICE

This application is a division of U.S. Ser. No. 11/365,873 filed Mar. 2, 2006, now U.S. Pat. No. 7,354,859.

This application is based on Japanese Patent application NO. 2005-057972, the content of which is incorporated hereinto by reference.

BACKGROUND

1. Technical Field

The present invention relates to a method of manufacturing a semiconductor device with a dual damascene structure.

2. Related Art

There has been known a dual damascene process by which an interconnection trench and a via hole are formed in an insulating interlayer, and a metal layer is buried in the interconnection trench and the via hole at the same time to form multilayer interconnection. A process has been described as the dual damascene process in, for example, Japanese Laid-Open patent publication NO. H11-163143. The dual damascene process described in the above publication is shown in FIGS. 7A to 7D.

In the first place, a hard mask 114 with an interconnection pattern is formed on an insulating film 112 formed on a substrate 110. Subsequently, a resist film is formed in such a way that the resist film covers the hard mask 114. Then, a resist film 116 with a via pattern is formed by etching the resist film. This via pattern is formed in the interconnection pattern (FIG. 7A). Subsequently, the resist film 116 is etched as a mask to form a via pattern 118 in the insulating film 112 (FIG. 7B). After the via pattern 118 is formed, the resist film 116 is removed for further etching. Thereby, a via hole 120 reaching an electrically conducting layer 111 formed on the substrate 110 is formed. In this case, an interconnection trench 122 is formed in the upper portion of the via hole 120 (FIG. 7C). The interconnection trench 122 is formed, and the hard mask 114 is removed to form the dual damascene structure.

In this dual damascene process disclosed in Japanese Laid-Open Patent Application Publication No. H11-163143, a mask pattern for self-alignment is formed just above the insulating film 112 with the hard mask 114 and the resist film 116. However, it has been difficult to form a fine interconnection structure, because accurate patterning and etching can not be realized when the hard mask 114 with this interconnection pattern is formed, and removed. Accordingly, a dual damascene process by which a fine interconnection structure can be formed has been required.

SUMMARY OF THE INVENTION

According to the present invention, there is provided a method of manufacturing a semiconductor device, the method including: forming a first film to be etched on an insulating layer formed on a semiconductor substrate; forming a first mask film with an opening on said first film to be etched; forming a second film to be etched on said first mask film in such a way that said opening is buried; forming a second mask film on said second film to be etched; forming an interconnection pattern in said second mask film located in the upper portion of said opening; forming an interconnection pattern by etching said second film to be etched by use of said second mask film as a mask, forming a via pattern by etching said first film to be etched by use of said first mask film exposed on the bottom of said interconnection pattern as a mask; and forming a via hole and an interconnection trench in the upper portion of said via hole in said insulating layer by selectively etching said insulating layer by use of said interconnection pattern and said via pattern, and forming an interconnection trench in the upper portion of said via hole.

According to the present invention, the interconnection patterns and the via pattern may be formed on the insulating layer at the same time with high accuracy by removing the first film and the second films to be etched in a selective manner during one etching process using the first and the second mask films as a mask. Thereby, the dual damascene structure with a fine interconnection structure may be formed with high accuracy.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be concretely explained, referring to attached drawings. Same components will be denoted by the same reference numbers, and the explanation will not be properly described.

FIGS. 1A to 3G are a schematic cross-sectional view showing a process in the method of manufacturing a semiconductor device according to a first embodiment of the present invention, respectively. FIG. 3H is a schematic top view showing a process in the method of manufacturing the semiconductor device according to the first embodiment of the present invention.

Figure 1A:
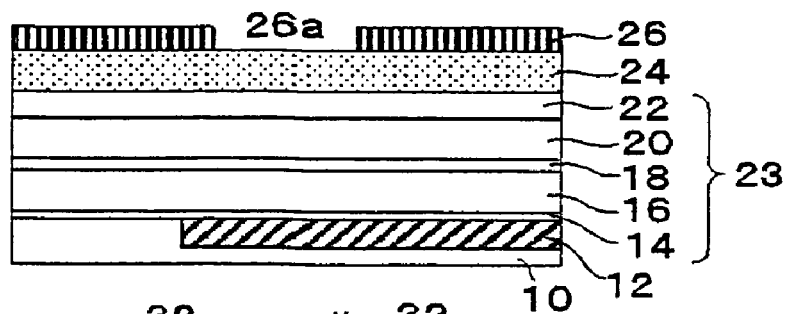
FIGS. 1A to 1C are a schematic cross-sectional view showing a process in the method of manufacturing a semiconductor device according to a first embodiment of the present invention, respectively.
Figure 1B:
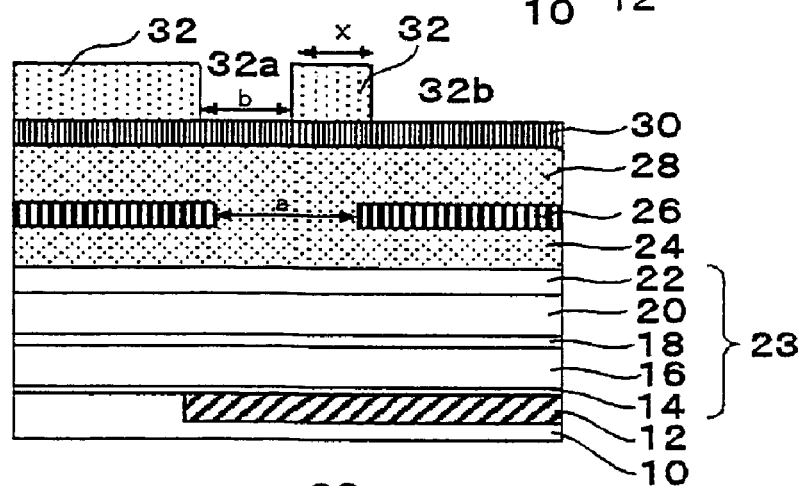

As shown in FIG. 1A, an insulating film 10 with a lower interconnection 12 is formed on a not-shown semiconductor substrate. An SiCN film 14, a first low dielectric constant layer 16, an SiC film 18, a second low dielectric constant layer 20, and an $SiO_2$ films 22 are stacked on the above insulating film 10 in this order to form an insulating layer 23. Though at least two layers may be stacked to form the insulating layer 23, an example in which the insulating layer 23 has a five-layer structure will be explained in the present embodiment.

In the first place, a first film to be etched 24, and a first mask film are formed on the insulating layer 23. A first mask film 26 with an opening 26a is formed by patterning in such a way that the first mask film has a predetermined shape. In the patterning, the size of the above opening 26a is made larger than a designed size for the via pattern by about 40 nm to 100 nm. However, the size of the opening 26a may be equal to that of the via pattern when the entire opening 26a is used as the via pattern. The via pattern is finally formed with one part of this opening 26a and the part of an interconnection pattern formed later.

An organic film such as a novolac resin, and an acrylic resin, which are commonly used, is used for the first film to be etched 24. A silicon-containing film such as a silicon-containing resist film, an organic spin-on-glass (SOG) film, and an inorganic antireflection film is used for the first mask film 26. Here, when the organic SOG film, and the inorganic antireflection film are used, a resist film 26 with a patterned shape of the opening 26a is formed on the above layers. Then, the opening 26a may be formed in these layers by etching.

When the opening 26a is formed in the first mask film 26, a second film to be etched 28 is formed on the first mask film 26 so that the second film 28 is buried into the opening 26a. Then, a second mask film 30 is formed on the second film to be etched 28. The second film to be etched 28 is more thickly applied than the first film to be etched 24.

A similar material to that of the above-described first film to be etched 24 is used for the second film to be etched 28. On the other hand, a silicon containing film such as a silicon-containing resist film, an organic SOG film, and an inorganic antireflection film is used for the second mask film 30. When the silicon-containing resist film is used for the second mask film 30, an interconnection pattern is formed by direct patterning of the silicon-containing resist film. Moreover, when the organic SOG film and the inorganic antireflection film are used, an interconnection pattern is formed on the above films by use of resist as will be described later.

When the second mask film 30 is formed, a chemically amplified positive resist is applied on this mask film 30 to form a resist film. The resist film 32 with interconnection patterns 32a and 32b, which are separated from each other by a designed separation width X, is formed (FIG. 1B) by exposing the above resist film 32 for a desired interconnection pattern and developing. Though a case in which the width a of the opening 26a is larger than the width b of the interconnection pattern 32a as shown in FIG. 1A has been shown in the first embodiment, the present invention is not limited to the above-described case, the width b may be larger than the width a.

Figure 1C:
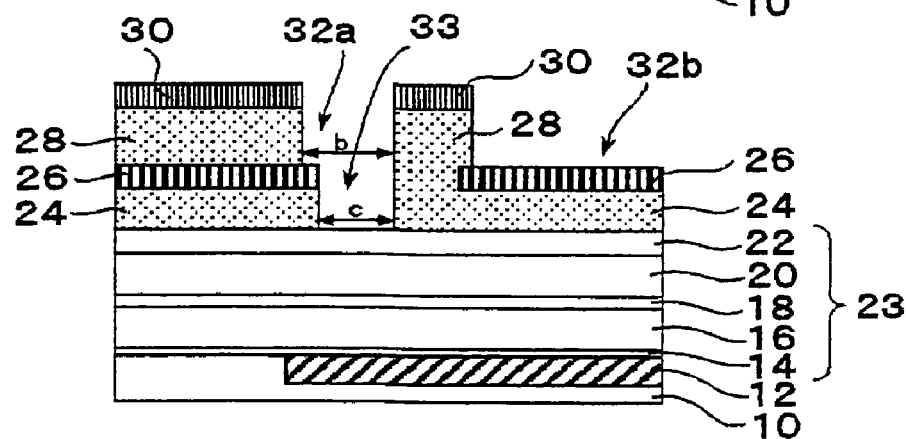

Subsequently, the second mask film 30 is etched by use of the resist film 32, on which a desired interconnection pattern is formed, as a mask. Furthermore, the second film to be etched 28 and the first film to be etched 24 are removed in one etching process by use of the resist film 32 and the etched second mask film 30 as mask. Firstly, etching is stopped before the first mask film 26 to form the interconnection patterns 32a and 32b. A part of the first mask film 26 may be exposed on the bottom of the interconnection pattern 32a, and the first film to be etched 24 is continuously etched by use of the part of the first mask film 26 as a mask to form a via pattern 33 on the insulating layer 23. That is, the first mask film 26 is hardly etched, and the via pattern 33 is formed for the interconnection pattern 32a in an self-aligning manner, because etching gas containing oxygen is used for etching of the first film to be etched 24 and the second film to be etched 28. The via pattern 33 is formed in such a way that the width c is smaller than the width b of the interconnection pattern 32a. Moreover, the remaining resist film 32 is removed by ashing and the like (FIG. 1C).

Thus, the first film to be etched 24 and the second film to be etched 28 are selectively removed in one etching process by use of the first mask film 26 and the second mask film 30 as a mask, and the interconnection patterns 32a and 32b, and the via pattern 33 may be formed on the insulating layer at the same time with high accuracy. Accordingly, the dual damascene structure with a fine interconnection structure may be formed with high accuracy.

A dual damascene structure securing the interconnection isolation spacing may be formed with high accuracy by sequential dry etching using the mask to which the via pattern 33 is formed, and the mask to which the interconnection patterns 32a and 32b are formed as will be described later.

Figure 2D:
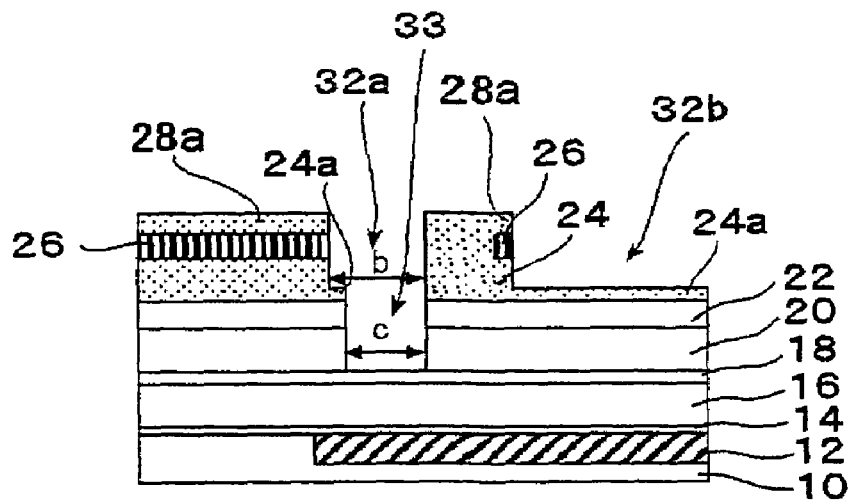
FIGS. 2D to 2F are a schematic cross-sectional view showing a process in the method of manufacturing the semiconductor device according to the first embodiment, respectively.
Figure 2E:
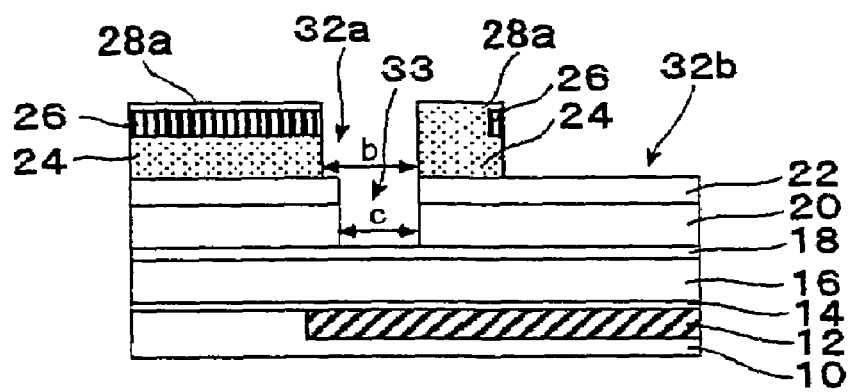

After the via pattern 33 is formed in an self-aligning manner as described above, the insulating layer 23 is further etched. Concretely, etching is applied and stopped before an SiC film 18 of an etching stopper in the bottom of the via pattern 33 by use of the first mask film 26 and the second mask film 30 as a mask. Thereby, the via pattern 33 is formed in the layer including the $SiO_2$ film 22 and the second low dielectric constant film 20. Furthermore, the second mask film 30, the second film to be etched 28, the first mask film 26, and the first film to be etched 24 are also etched during the above etching (FIG. 2D). The first film to be etched 24, and the second film to be etched 28 are formed thick in such a way that, when the etching is completed, the first film to be etched 24a remains on the $SiO_2$ film 22, and the second film 28a to be etched 28a remains on the first mask film 26.

Then, the first film to be etched 24a, which remains on the $SiO_2$ film 22, is removed by the dry etching technology and the like. On the other hand, the second film to be etched 28a, which remains on the first mask film 26, remains without being completely removed by etching. That is, the second film to be etched 28 is not completely removed, and remains on the first mask film 26 (FIG. 2E), because the second film to be etched 28 is configured to be formed sufficiently thicker than the first film to be etched 24.

Figure 2F:
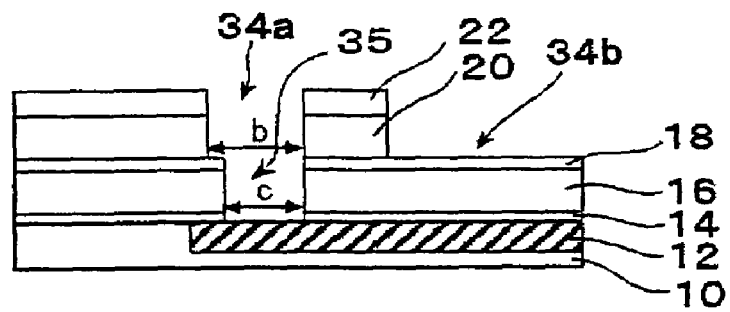
Figure 3G:
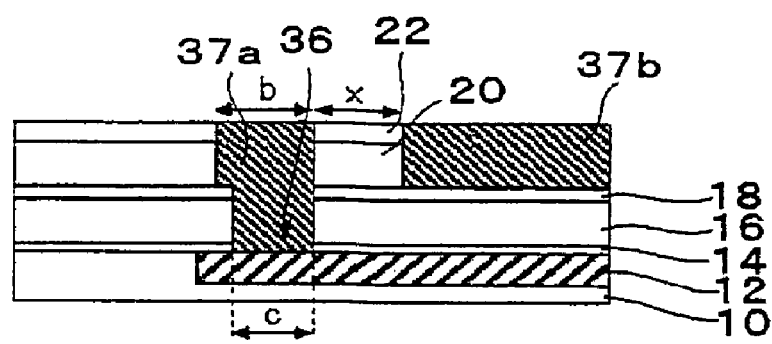
FIG. 3G is a schematic cross-sectional view of a dual damascene structure.
Figure 3H:
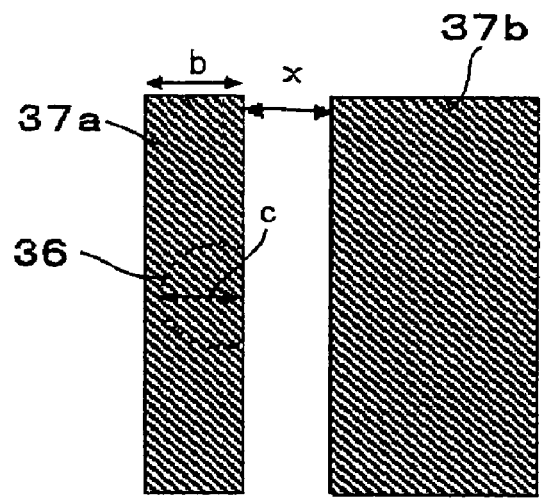
FIG. 3H is a schematic top view of the dual damascene structure.

Subsequently, the SiC film 18, the first low dielectric constant film 16, and, the SiCN film 14, which are located just under the bottom of the via pattern 33 formed as described above, are etched to form a via hole 35. According to this embodiment, the via hole 35 is formed by printing the shape of via pattern 33. Therefore, the width c of via hole 35 is about the same length as the width c of via pattern formed in first film to be etched 24. Then, the $SiO_2$ film 22 and the second low dielectric constant film 20, which are located just under the interconnection patterns 32a and 32b, are etched by etching condition according to which an SiC etching rate is sufficiently low, and etching is stopped before the SiC film 18. Thereby, interconnection trenches 34a and 34b are formed. According to this embodiment, the interconnection trench 34a is formed by printing the shape of interconnection pattern 32a. Therefore, the width b of the interconnection trench 34a is about the same length as the width b of interconnection pattern formed in the resist film 32, the second mask film 30 and the second film to be etched 28. Furthermore, the first film to be etched 24 and the like, which remains on the SiO$_2$ film 22, is removed by using a technology such as ashing (FIG. 2F).

Then, a metallic material is buried into the interconnection trenches 34a and 34b, and the via hole 35. Concretely, the inner walls of the interconnection trenches and the inner wall of the via hole 35 are covered with the barrier metal layer by forming a barrier metal layer is on the upper surface of the insulating film. Then, the metal film is buried into the interconnection trenches 34a and 34b, and the via hole 35 by forming a metal layer on the upper surface of the insulating layer. Thereafter, chemical mechanical polishing (CMP) is applied to leave the barrier metal layer and the metal layer in the interconnection trenches 34a and 34b, and the via hole 35. According to such a process, there is formed the dual damascene structure, which includes a via 36 with width c and an interconnection 37a with width b, and an upper-layer interconnection 37b as shown in the schematic cross-sectional view of FIG. 3G, and in the schematic top view of FIG. 3H.

Subsequently, the advantages of the method of manufacturing a semiconductor device according to the present invention will be explained.

According to the method of manufacturing a semiconductor device of this invention, the first and the second films to be etched may be removed in one etching process by use of the first and the second mask films as a mask to form the interconnection pattern and the via pattern on the insulating layer at the same time with high accuracy. Accordingly, the dual damascene structure with a fine interconnection structure may be formed with high accuracy.

On the other hand, in the conventional method of manufacturing a semiconductor device as shown in FIGS. 7A to 7D, the resist film is formed on the hard mask 114 in such a way that the above interconnection pattern is buried after a protection film is etched to form the hard mask 114 formed with a predetermined interconnection pattern. Then, the via pattern is formed on this resist film to form the resist film 116. According to the conventional method, even the insulating film 112 is etched when the hard mask 114 with the interconnection pattern is formed. Thereby, there are caused irregularities on the surface of the insulating film 112 located in the bottom of the interconnection pattern. Since the resist film 116 is forced to be formed on the surface of the insulating film 112 with the irregularities, it is difficult to form a fine pattern. Moreover, the interconnection pattern and the via pattern are formed by use of a mask of a single layer with a thin film-thickness. Accordingly, there is caused low resistance to etching and the like, and it is impossible to form the interconnection trench 122 and the via hole 120 on the insulating film 112 with high accuracy. That is, the interconnection isolation spacing is decreased to reduce the reliability of interconnections.

Figure 7A:
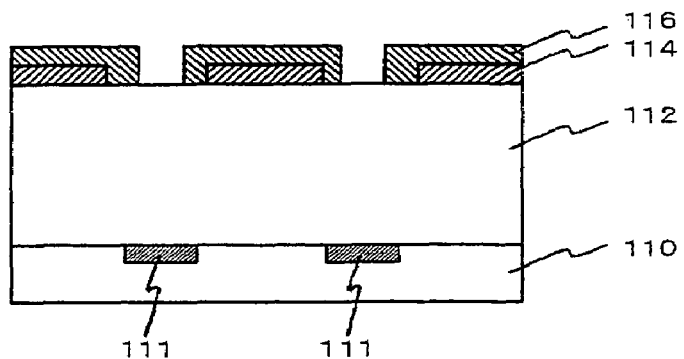
FIGS. 7A to 7D are a schematic cross-sectional view showing a process in a conventional method of manufacturing a semiconductor device.
Figure 7B:
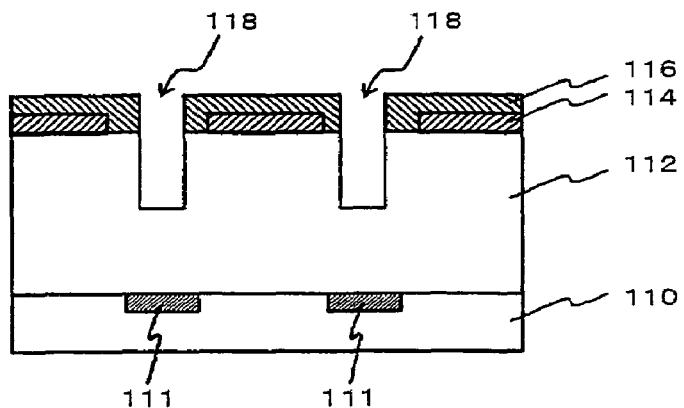
Figure 7C:
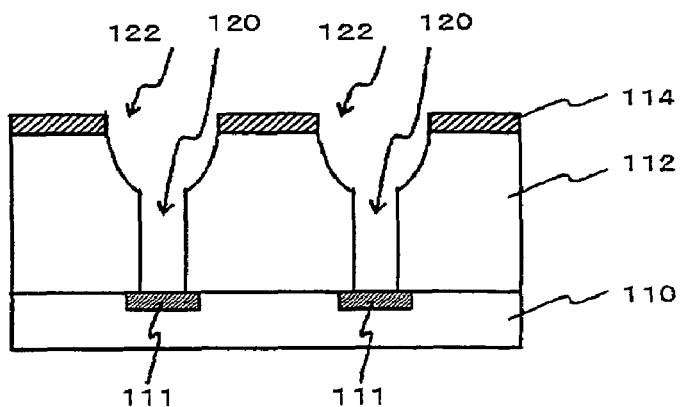
Figure 7D:
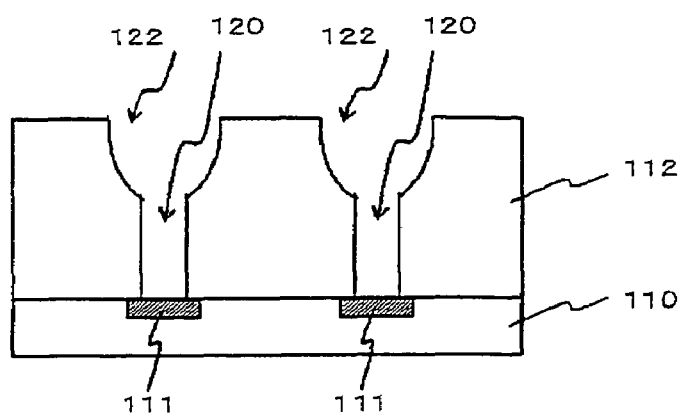

Moreover, it is very difficult in the conventional method of manufacturing a semiconductor device to selectively remove the hard mask 114 from the insulating film 112 during a process in which the hard mask 114 including a nitride film is removed (a process from FIGS. 7C to 7D). Accordingly, when the hard mask 114 is removed by the dry etching technology, the upper portion of the insulating film 112 is also etched to decrease the interconnection isolation spacing and to reduce the reliability of interconnections. On the other hand, when the hard mask 114 is removed by, for example, a wet etching technology using phosphoric acid and the like, electrically conducting layer 111 is etched to reduce the reliability of interconnections. Moreover, a tendency to reduce the reliability of interconnections becomes more remarkable when a low-k film is used for the insulating film 112. Since the finer interconnection caused an aspect ratio to be increased, the above tendency to reduce the reliability of interconnections becomes further remarkable.

On the other hand, the first film to be etched 24 and the second film to be etched 28 are formed on the SiO$_2$ film 22 in the method of manufacturing a semiconductor device according to the present invention. A mask pattern for the dual damascene structure may be formed in one etching process by combination of the above films 24 and 28 with the first mask film 26 and the second mask film 30. Accordingly, a fine pattern may be easily formed because another process is not required for forming the interconnection pattern and the via pattern.

Furthermore, the film 24 to be etched is formed between the first mask film 26 formed with the via pattern and the insulating layer 23, wherein the film to be etched 24 is of an organic film, and the film to be etched 28 is formed between the second mask film 30 formed with the interconnection pattern and the first mask film 26, wherein the film to be etched 28 is of an organic film. That is, since the mask pattern may be formed thick, the via hole and the interconnection hole may be simultaneously formed in the insulating layer deep in the thickness direction. Moreover, because the mask pattern has been formed thick, resistance to etching and the like for a mask pattern is improved and the interconnection trench and the via hole may be formed in the insulating layer with high accuracy.

Thus, the risk of a short-circuit in the interconnections may be avoided to realize the dual damascene structure with high reliability because the interconnection trench and the via hole may be formed in the insulating layer with high accuracy, and a margin for the distance between the interconnections is increased. Furthermore, a tolerance for the deviation (alignment deviation) allowance of a pattern forming position is larger in comparison with that of the conventional method because the interconnection pattern and the via pattern may be formed with high accuracy in one etching process. Accordingly, a focusing margin, and, at the same time, an alignment-deviation margin may be secured. Furthermore, the size of the opening 26a formed in the first mask film 26 may be formed larger than that of the via pattern, and an exposing margin may be secured when the via pattern is formed. Thus, a miniaturization, higher integration and speeding-up of a semiconductor element may be realized to further improve the yield because the margins are larger during processes in which the interconnection trench and the via hole are formed.

In the method of manufacturing the semiconductor device according to the present invention, the first and the second films to be etched may be formed from an organic film. Accordingly, the above films to be etched may be easily removed by etching and ashing to easily form a pattern.

Furthermore, the first and the second mask films may be formed from a silicon containing film. Accordingly, the first and the second films to be etched may be selectively etched by using etching gas which contains oxygen, wherein the films include an organic film. Accordingly, the interconnection pattern and the via pattern may be simultaneously formed with high accuracy.

Hereinafter, a second embodiment according to the method of manufacturing a semiconductor device will be explained.

FIGS. 4A to 6H are schematic cross-sectional view s showing the second embodiment.

Figure 4A:
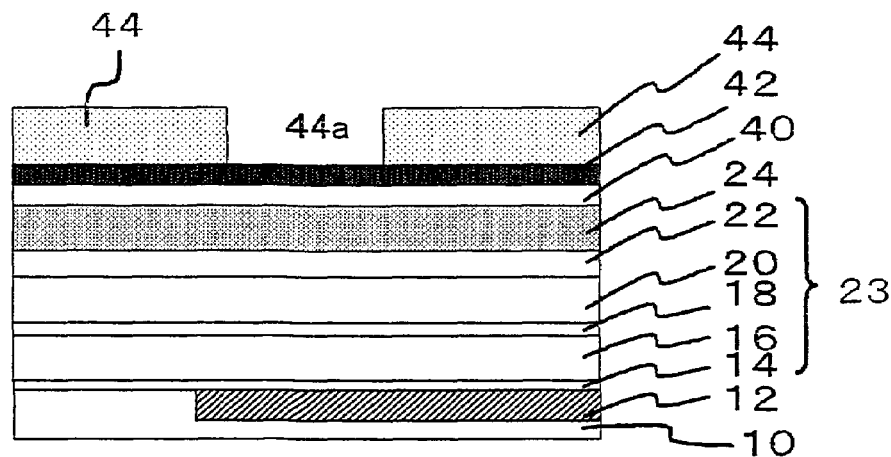
FIGS. 4A to 4C are a schematic cross-sectional view showing a process in a method of manufacturing a semiconductor device according to a second embodiment of the present invention, respectively.

As shown in FIG. 4A, an insulating film 10 with a lower interconnection 12 is formed on a not-shown semiconductor substrate. An insulating layer 23 is formed on the lower interconnection 12 in the same manner as that of the first embodiment. A first film to be etched 24, a first mask film 40, an organic antireflection film 42, and a positive-type resist film are stacked on the insulating layer 23 in this order. Patterning of the positive-type resist film is applied in such a way that the resist film has a predetermined shape, and a positive-type resist film 44 with an opening 44a is formed. In the patterning, the size of the above opening 44a is made larger than a designed size for a via pattern by about 40 nm to 100 nm. However, the size of the opening 44a may be equal to that of the via pattern when the entire opening 44a is used as the via pattern. An inorganic film such as an $SiO_2$ film, an SiCN film, an SiN film, and an SiC film is used for the first mask film, wherein the inorganic film is of low-temperature deposition.

Figure 4B:
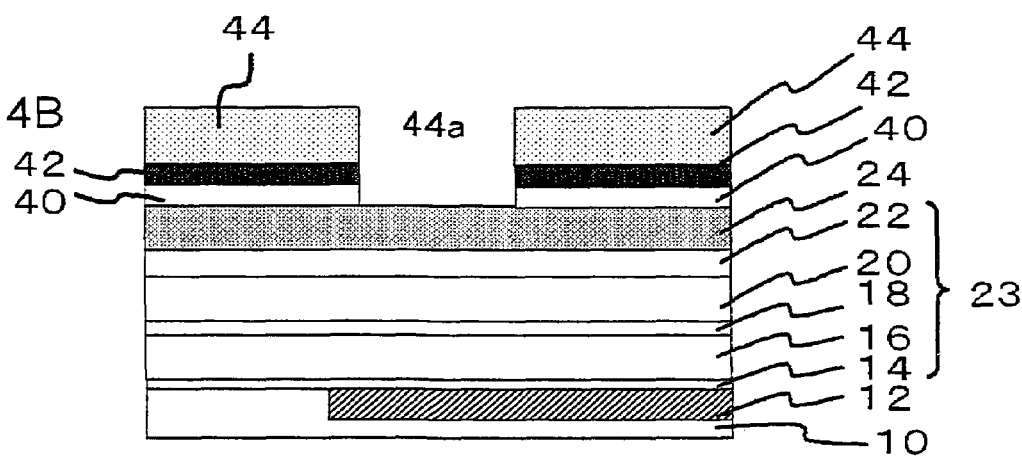
Figure 4C:
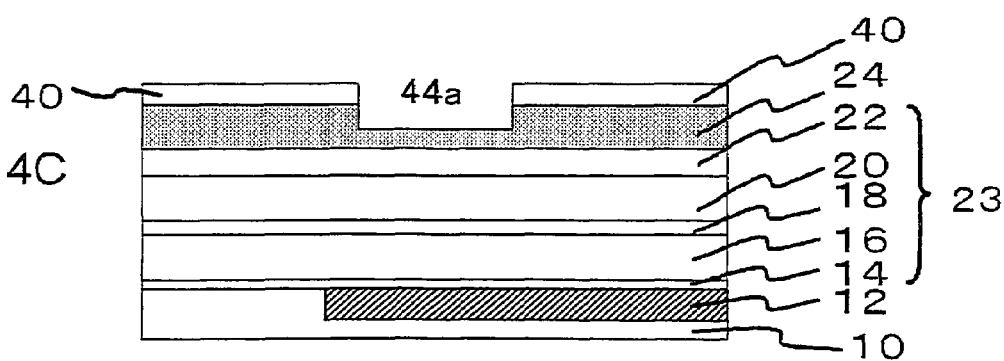

Subsequently, the organic antireflection film 42 located just under the opening 44a, and the first mask film 40 are etched by use of the positive-type resist film 44 as a mask (FIG. 4B). Subsequently, the remaining resist film 44 and the organic antireflection film 42 are removed by ashing and the like (FIG. 4C).

Then, a second film to be etched 28 is formed in such a way that the opening 44a is buried. Furthermore, a second mask film 48 is formed on the second film to be etched 28. Furthermore, an organic antireflection films 50 are stacked on the second mask film 48. A chemically amplified positive resist is applied onto the organic antireflection film 50 to form a resist film. A resist film 32 with interconnection patterns 32a and 32b, which are separated from each other by a designed separation width X, is formed (FIG. 5D) by exposing and developing the above resist film for a desired interconnection pattern.

A similar material to that of the first mask film 40 is used for the second mask film 48.

Subsequently, the organic antireflection film 50, and the second mask film 48 are etched by use of the resist film 32 formed with the desired interconnection patterns 32a and 32b as a mask, and the interconnection patterns 32a and 32b are formed on the above films 50 and 48. Then, the first film to be etched 24 and the second film to be etched 28 are etched in one process by use of the organic antireflection film 50 and the second mask film 48, which have been etched, as a mask. Etching gas containing oxygen is used for etching of the first film to be etched 24 and the second film to be etched 28. Accordingly, when the second film to be etched 28 is etched by use of the second mask film 48 as a mask, etching is stopped before the first mask film 40 to form the interconnection patterns 32a and 32b.

Figure 5D:
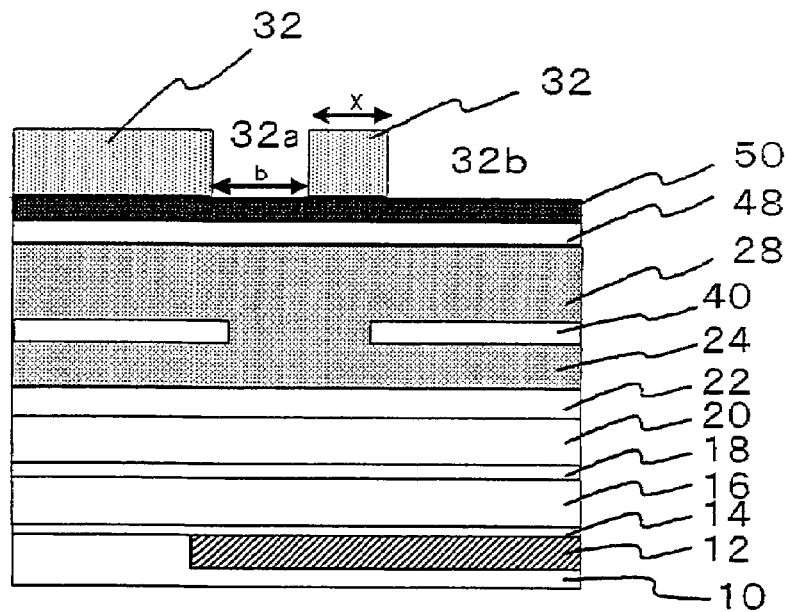
FIGS. 5D and 5E are a schematic cross-sectional view showing a process in the method of manufacturing the semiconductor device according to the second embodiment, respectively.
Figure 5E:
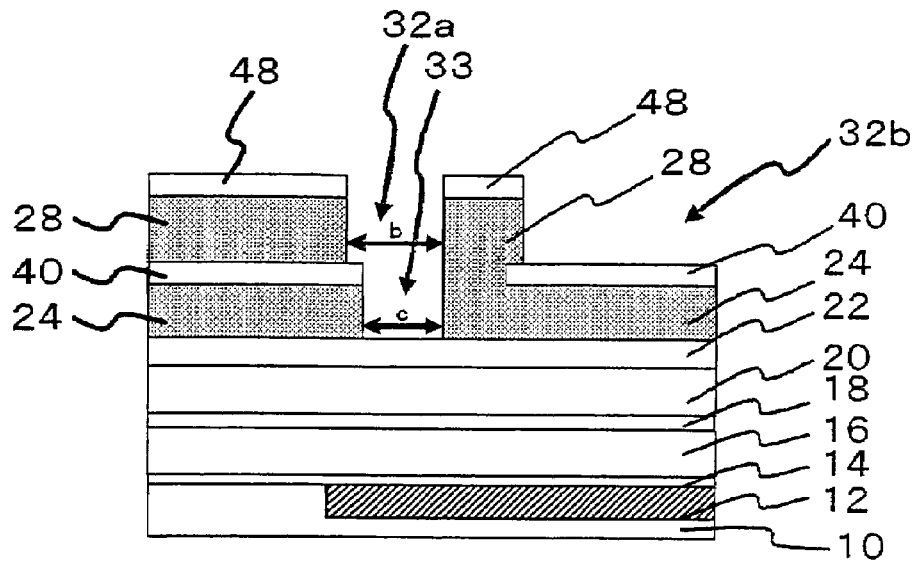

A part of the first mask film 40 is exposed on the bottom of the interconnection pattern 32a, and the first film to be etched 24 is etched by use of the part of the first mask film 40 as a mask to form a via pattern 33 on an $SiO_2$ film 22. That is, the first mask film 40 is hardly etched, and the via pattern 33 is formed for the interconnection pattern 32a in an self-aligning manner. Furthermore, the remaining resist film 32 and the organic antireflection film 50 are removed by ashing and the like (FIG. 5E).

Figure 6F:
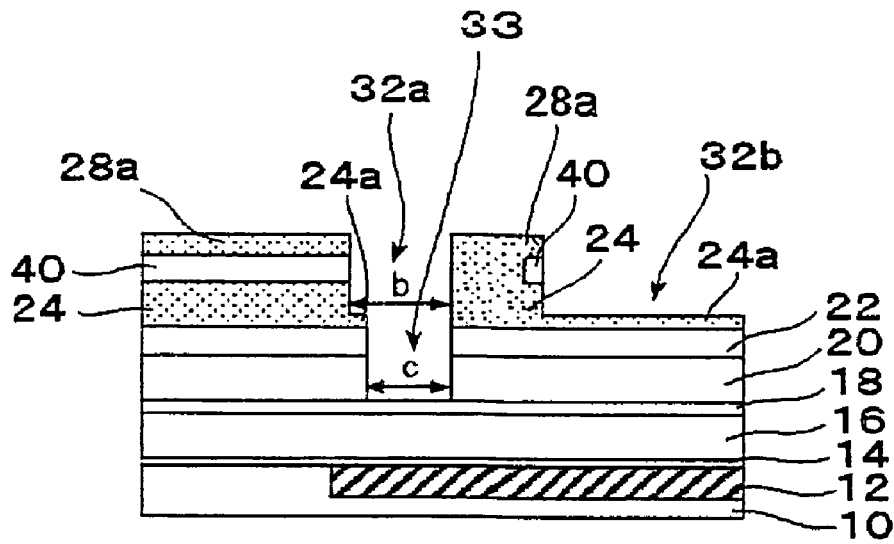
FIGS. 6F to 6H are a schematic cross-sectional view showing a process in the method of manufacturing the semiconductor device according to the second embodiment, respectively.
Figure 6G:
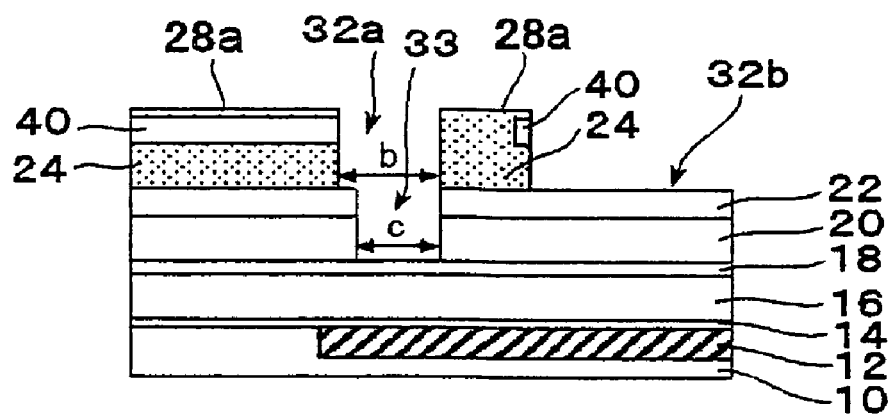
Figure 6H:
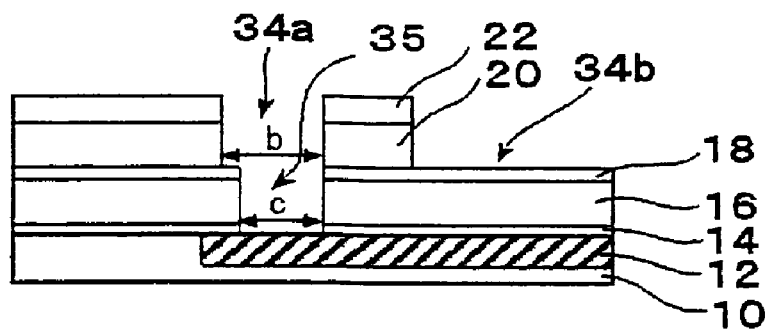

When the via pattern 33 and the interconnection patterns 32a, and 32b are formed on the $SiO_2$ film 22 as described above, interconnection trenches 34a and 34b, and a via hole 35 are formed in the insulating layer 23 according to a similar process to that of the above-described first embodiment (FIGS. 6F to 6H). Furthermore, a metal layer is buried into the interconnection trenches 34a and 34b, and the via hole 35. According to such a process, there is formed the dual damascene structure, which includes a via 36 and an interconnection 37a, and an upper-layer interconnection 37b as shown in the schematic cross-sectional view of FIG. 3G, and in the schematic top view of FIG. 3H.

In the second embodiment, an inorganic film of low-temperature deposition, which is formed according to chemical vapor deposition (CVD) method, and the like are used as the first and the second mask films, instead of the organic SOG film and the silicon-containing resist film, which have been illustrated in the first embodiment. Thereby, blending (mixing) of films formed by application may be prevented for a combination of the organic film (film to be etched) and the organic SOG film (mask film), that of the organic film (film to be etched) and the silicon-containing resist film (mask film), and the like. Accordingly, a combination of a film to be etched and a mask film may be freely selected to expand the scope of selection of conditions for manufacturing a semiconductor element.

In the above-described embodiment according to the present invention, the following combinations of (1) through (16) may be listed as a combination of the first mask film and the second mask film.

Specifically, the following combinations may be used as that of the first mask film and the second mask film:
(1) a silicon-containing resist film and an organic SOG film;
(2) a silicon-containing resist film and an inorganic antireflection film;
(3) a silicon-containing resist film and silicon-containing resist film;
(4) a silicon-containing resist film and an inorganic film of low-temperature deposition;
(5) an organic SOG film and an organic SOG film;
(6) an organic SOG film and an inorganic antireflection film;
(7) an organic SOG film and a silicon-containing resist film;
(8) an organic SOG film and an inorganic film of low-temperature deposition;
(9) an inorganic antireflection film and an organic SOG film;
(10) an inorganic antireflection film and an inorganic antireflection film;
(11) an inorganic antireflection film and a silicon-containing resist film;
(12) an inorganic antireflection film and an inorganic film of low-temperature deposition
(13) an inorganic film of low-temperature deposition and an organic SOG film;
(14) an inorganic film of low-temperature deposition and an inorganic antireflection film;
(15) an inorganic film of low-temperature deposition and a silicon-containing resist film; and
(16) an inorganic film of low-temperature deposition and an inorganic film of low-temperature deposition.

The first and the second films to be etched, which include an organic film, may be selectively etched by the above-described combinations to form the interconnection pattern and the via pattern with high accuracy.

The embodiments according to the present invention has been described as explained above, referring to the drawings. But the embodiments are to be considered as illustrative, and various kinds of configurations other than those of the above-described embodiments may be applied.

It is apparent that the present invention is not limited to the above embodiment, that may be modified and changed without departing from the scope and spirit of the invention.

What is claimed is:

1. A method of fabricating a semiconductor device, comprising:
    forming a first film with an opening on an insulating layer formed on a semiconductor substrate;
    forming a second film on said first film in such a way that said opening is buried;

forming a trench pattern on said second film so that said trench pattern overlaps with said opening portion;

forming a via pattern by etching said first film using said trench pattern to expose said insulating layer; and forming a via hole and an interconnect trench in the upper portion of said via hole in said insulating layer employing said via pattern and said trench pattern, wherein a width of said via hole depends on a part of said trench pattern and said opening having a larger width than said width of the via hole.

2. The method of claim 1, wherein one side of said trench pattern is between said opening.

3. The method of claim 1, wherein said first film is a multilayer.

4. The method of claim 1, wherein said second film is a multilayer.

5. The method of claim 1, wherein said insulating layer is a multilayer.

* * * * *